United States Patent
Behringer et al.

(10) Patent No.: US 11,070,306 B2
(45) Date of Patent: Jul. 20, 2021

(54) METHOD OF TRANSMITTING DATA AND TRANSMISSION SYSTEM

(71) Applicant: OSRAM OLED GmbH, Regensburg (DE)

(72) Inventors: Martin Rudolf Behringer, Regensburg (DE); Hubert Halbritter, Dietfurt (DE); Roland Heinrich Enzmann, Gelugor (MY)

(73) Assignee: OSRAM OLED GmbH, Regensburg (DE)

( * ) Notice: Subject to any disclaimer, the term of this patent is extended or adjusted under 35 U.S.C. 154(b) by 0 days.

(21) Appl. No.: 16/633,753

(22) PCT Filed: Aug. 10, 2018

(86) PCT No.: PCT/EP2018/071766
§ 371 (c)(1),
(2) Date: Jan. 24, 2020

(87) PCT Pub. No.: WO2019/042743
PCT Pub. Date: Mar. 7, 2019

(65) Prior Publication Data
US 2020/0213028 A1 Jul. 2, 2020

(30) Foreign Application Priority Data
Aug. 31, 2017 (DE) .......................... 102017120006.1

(51) Int. Cl.
*H04B 10/00* (2013.01)
*H04J 14/02* (2006.01)
(Continued)

(52) U.S. Cl.
CPC ........ *H04J 14/0227* (2013.01); *G02B 6/0068* (2013.01); *G02B 6/43* (2013.01);
(Continued)

(58) Field of Classification Search
CPC combination set(s) only.
See application file for complete search history.

(56) References Cited

U.S. PATENT DOCUMENTS

| 10,236,952 B1* | 3/2019 | Sadot | H04W 52/42 |
| 2002/0126338 A1* | 9/2002 | Volpi | H04B 10/1125 398/9 |

(Continued)

FOREIGN PATENT DOCUMENTS

| DE | 101 27 541 | 12/2002 |
| DE | 10 2012 001 398 | 8/2013 |

(Continued)

*Primary Examiner* — Agustin Bello
(74) *Attorney, Agent, or Firm* — DLA Piper LLP (US)

(57) ABSTRACT

A method of transmitting optical data includes providing a plurality of light sources in a transmission system, transmitting a data signal with data to be transmitted to the transmission system, decomposing the data signal in the transmission system into N different sub-signals, wherein N is a natural number with N≥2, and controlling the light sources based on the sub-signals such that each of the light sources emits light according to one of the sub-signals and the light emitted overall by the light sources transmits the data.

16 Claims, 6 Drawing Sheets

(51) Int. Cl.
*F21V 8/00* (2006.01)
*G02B 6/43* (2006.01)
*G02F 1/13357* (2006.01)
*G02F 1/225* (2006.01)
*H01S 5/183* (2006.01)
*H04B 10/114* (2013.01)
*H04B 10/116* (2013.01)
*G02F 1/1335* (2006.01)

(52) U.S. Cl.
CPC ...... *G02F 1/133606* (2013.01); *G02F 1/2257* (2013.01); *H01S 5/18311* (2013.01); *H04B 10/116* (2013.01); *H04B 10/1149* (2013.01); *G02F 1/133607* (2021.01)

(56) References Cited

U.S. PATENT DOCUMENTS

| | | | |
|---|---|---|---|
| 2002/0181063 A1 | 12/2002 | Kropp | |
| 2006/0093378 A1* | 5/2006 | Sicard | H04B 10/506 398/195 |
| 2006/0193634 A1* | 8/2006 | Wang | H04B 10/1141 398/118 |
| 2010/0188004 A1* | 7/2010 | Baggen | H04B 10/116 315/209 R |
| 2013/0195464 A1* | 8/2013 | Fath | H04B 10/114 398/96 |
| 2013/0223846 A1* | 8/2013 | Joseph | G02B 27/0944 398/119 |
| 2016/0277175 A1* | 9/2016 | Lyubomirsky | H04L 25/03 |
| 2016/0294472 A1* | 10/2016 | Palmer | H04B 7/0617 |
| 2018/0359031 A1* | 12/2018 | Raynor | G06T 7/70 |
| 2020/0213028 A1* | 7/2020 | Behringer | G02F 1/2257 |

FOREIGN PATENT DOCUMENTS

| | | |
|---|---|---|
| EP | 1 696 586 | 8/2006 |
| EP | 2 621 111 | 7/2013 |
| GB | 2 419 738 | 5/2006 |
| TW | 201717563 | 5/1917 |
| WO | 2009/010916 | 1/2009 |

* cited by examiner

METHOD OF TRANSMITTING DATA AND TRANSMISSION SYSTEM

TECHNICAL FIELD

This disclosure relates to a method of transmitting data and a transmission system.

BACKGROUND

It could be helpful to provide a method and a transmission system by which optically high data rates can reliably be transmitted.

SUMMARY

We provide a method of transmitting optical data including providing a plurality of light sources in a transmission system, transmitting a data signal with data to be transmitted to the transmission system, decomposing the data signal in the transmission system into N different sub-signals, wherein N is a natural number with N≥2, and controlling the light sources based on the sub-signals such that each of the light sources emits light according to one of the sub-signals and the light emitted overall by the light sources transmits the data.

We also provide a transmission system configured to perform the method of transmitting optical data including providing a plurality of light sources in a transmission system, transmitting a data signal with data to be transmitted to the transmission system, decomposing the data signal in the transmission system into N different sub-signals, wherein N is a natural number with N≥2, and controlling the light sources based on the sub-signals such that each one of the light sources emits light according to one of the sub-signals and the light emitted overall by the light sources is configured to transmit the data.

We further provide a method of transmitting optical data including providing a plurality of light sources in a transmission system, transmitting a data signal with data to be transmitted to the transmission system, decomposing the data signal in the transmission system into N different sub-signals, wherein N is a natural number with N≥2, and controlling the light sources based on the sub-signals such that each of the light sources emits light according to one of the sub-signals and the light emitted overall by the light sources transmits the data, wherein 4 to 200 of the light sources are unambiguously assigned to each sub-signal, each sub-signal is supplied to associated light sources via a dedicated electrical supply line, and the light sources associated with a specific sub-signal are each arranged block by block, seen in plan view so that a field of at least 2×2 of the light sources is formed.

Figure 1:
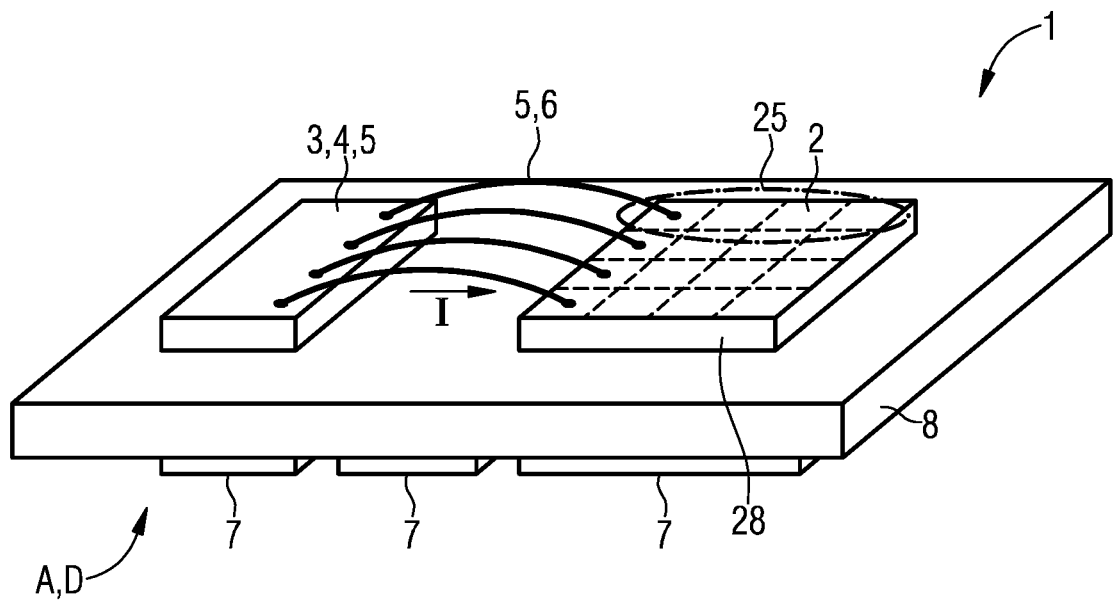
FIG. 1 is a schematic perspective view of an example of a transmission system.

LIST OF REFERENCES SIGNS 1 transmission system
2 light source
21 resonator
22 semiconductor layer sequence
23 growth direction of the semiconductor layer sequence
24 aperture
25 group of light sources for the same sub-signal
26 resonator mirror
27 electrode
28 semiconductor chip
29 substrate
3 receiving device
4 data processing unit
5 driver unit
6 electrical supply line
7 electrical contact surface
8 carrier
9 receiver
10 optical element
A data signal
D data
GND earth, ground
I current
R light
S sub-signal
V voltage

DETAILED DESCRIPTION

Our method is used for transmitting data. In particular, digital data can be transmitted by the method. The data is preferably transmitted exclusively optically. The term optically can mean that the data transmission is limited to the wavelength of 200 nm to 3 μm.

We also provide a transmission system. The transmission system is configured for data transmission. For this purpose, the transmission system comprises a plurality of light sources. The light sources are preferably configured to generate near-ultraviolet radiation, visible light and/or near-infrared radiation, preferably for the emission of near-infrared radiation in particular at a wavelength of 810 nm to 970 nm.

A data signal may be transmitted to the transmission system. The data signal may comprise or consist of data to be transmitted. The data signal can be wired to the transmission system or can be transmitted via a radio link to the transmission system. In particular, the data signal is a digital signal.

The method may comprise the step of decomposing the data signal in the transmission system into N different sub-signals. No data is lost in decomposition of the data signal. That is, the complete data to be transmitted is contained in the sum of the sub-signals. In this example, the data can be contained redundantly, that is, multiple times in the sub-signals. Alternatively, the sub-signals are free of redundancies. It is possible that only a portion of the sub-signals is required to reproduce the data signal, in particular if the sub-signals are partially redundant, or it is necessary to assemble all sub-signals to reconstruct the data signal and thus the data. In particular, several of the sub-signals are necessary to reproduce the data of the data signal.

N is a natural number. Preferably, N is at least 2 or at least 4 or at least 10 or at least 20. For example, N is 100 to $10^6$, or 200 to $10^5$, or 500 and $10^4$.

The method may comprise the step of controlling the light sources on the basis of the sub-signals. That is, each of the light sources emits light according to one of the sub-signals. By the light emitted overall by the light sources and emitted by the transmission system, the data of the data signal that has been transmitted to the transmission system, is sent. The emitted light is preferably not a trivial modification of the data signal. Particularly preferably, the light from light sources that are assigned to a plurality or to all sub-signals, is required to reconstruct and/or completely transmit the data.

The method may be configured for data transmission and comprises the following steps, for example, in the specified sequence:

providing a plurality of light sources in a transmission system, transmitting a data signal with data to be transmitted to the transmission system, decomposing the data signal in the transmission system into N different sub-signals, where N is a natural number greater than or equal to 2, and controlling the light sources on the basis of the sub-signals such that each of the light sources emits light according to one of the sub-signals and the light emitted overall by the light sources transmits the data.

For LiFi applications, for example, based on OFDM coding, visibly emitting light-emitting diodes, pixelated light-emitting diodes or infrared-emitting diodes are usually used. These are coded by OFDM to achieve high data rates. OFDM means orthogonal frequency division multiplexing. LiFi means light fidelity and denotes an optical data transmission method in particular over short distances, also referred to as visible light communications, VLC for short. LiFi is in particular an optical equivalent to WLAN realized by radio technology.

However, light emitting diodes (LEDs) are generally limited in terms of their modulation speed. Arrays of LEDs can provide high optical powers. Because of the comparatively high modulation currents required for such an array, however, the modulation frequency and thus the data rate are limited in terms of inductance.

The method can be used to operate a transmission system preferably having individually addressable VCSEL arrays. Each array can be subjected to a different modulation frequency, in particular by the sub-signals. The modulation frequency is also referred to as a carrier. In contrast to a conventional OFDM approach in which the totality of the optical transmission elements is controlled with an already processed signal with a current $I\_0$, in our method, each segment, that is, each array or each group of light sources, is driven with a current of only $I\_0/N$. In inductance-limited systems, this means an increase by a factor N of a possible bandwidth and, thus, multiplication of a possible, transmittable data rate. In addition, redundancies can be achieved by decomposition of the data signal into the sub-signals.

A part of the light sources or in all light sources may be surface-emitting semiconductor lasers. In particular, the semiconductor lasers have a resonator in the direction parallel to a growth direction of a semiconductor layer sequence of the semiconductor lasers. That is, the semiconductor lasers may be VCSELs, wherein VCSEL means vertical cavity surface emitting laser. The semiconductor lasers are preferably arranged in one or more arrays.

The light sources may each be operated with a mean driver current reduced by a factor N compared to a control of the light sources directly by the data signal. This is made possible by decomposition into the N different sub-signals.

The same semiconductor layer sequence may be used for all the light sources. That is, all light sources can be integrated in a common semiconductor chip. Alternatively, a plurality of semiconductor chips may be provided for the light sources, wherein preferably each of the semiconductor chips has a plurality of light sources and in turn within a semiconductor chip the light sources can be produced from the same semiconductor layer sequence. The semiconductor layer sequence can each extend continuously and contiguously over the light sources of the semiconductor chip or can partially or completely be removed between adjacent light sources.

All light sources may be structurally identical, within the scope of manufacturing tolerances. Alternatively, the transmission system has different types of light sources, for example, to generate radiation with different wavelengths of maximum intensity. It is possible that the light sources are all based on the same semiconductor layer sequence and a different emission characteristic is set, for example, by different resonator lengths and/or different resonator mirror configurations. Alternatively, the differently emitting light sources are based on different semiconductor layer sequences and/or on different semiconductor chips.

The sub-signals are orthogonal to each other. This can mean that within a defined time window a scalar product of the sub-signals, in pairs, is equal to 0. In particular, the sub-signals are formed by different modulation frequencies, wherein the modulation frequencies are orthogonal to one another.

The data signal may be broken down into the sub-signals by an orthogonal frequency multiplex method (OFDM). The sub-signals are thus orthogonal to one another.

At least four or 10 or 20 of the light sources may be unambiguously assigned to each one of the sub-signals. Alternatively or additionally, this number is at most 400 or 200 or 100 or 50. Thus, sufficient remaining light sources are still present in the event of a failure of individual light sources of a sub-signal to emit the corresponding sub-signal. An increased redundancy with respect to the failure of individual light sources can thus be achieved.

Each sub-signal may be supplied to the associated light sources via a dedicated electrical supply line. Such a supply line is formed, for example, by a conductor track and/or by a bonding wire. That is, a supply of the sub-signals to the relevant light sources is preferably carried out physically independently of the other sub-signals for each sub-signal. It is possible for the number of sub-signals to be equal to the number of electrical supply lines, or the number of electrical supply lines exceeds the number of sub-signals by one.

This applies to a part or for an entire conductor path section to be bridged electrically from a data processing unit of the transmission system to the light sources. It is possible for separate electrical supply lines to be present only for one polarity, that is, either for the cathode or the anode. The second polarity can be formed by a common, preferably coherent and flat, electrical contact surface. In particular, separate electrical supply lines are present in that current path part, which, without division into the separate electrical supply lines, would otherwise be limited in terms of inductance with regard to the current intensity and/or modulation frequencies that can be implemented.

The light sources associated with a particular sub-signal may be arranged in a row-shaped manner when viewed from above. The light sources can be arranged along equally long, straight rows, wherein exactly one row is preferably present per sub-signal. Alternatively, a plurality of rows are present per sub-signal. The rows preferably extend completely across an array of the light sources and, therefore, can extend completely over rows and/or columns. As a result, an efficient electrical interconnection of the light sources associated with a specific sub-signal is possible.

The light sources assigned to a specific sub-signal may each be arranged block by block, seen in plan view. Block by block means, for example, that the light sources span a field of at least 2×2 of these light sources. The field preferably has a size of at least 3×2 or 3×3 or 4×4 of these light sources. Alternatively or additionally, the field has a size of at most 16×16 or 8×8 or 5×4 of the light sources assigned to a specific sub-signal. By such a block arrangement of the light sources, the light emitted by these light sources can be handled optically efficiently, for example, by lens systems or mirror systems.

The light sources associated with the sub-signals may be arranged in a mixed manner when viewed from above. At least one other light source associated with another of the sub-signals may be located between the nearest ones of the light sources associated with one of the sub-signals. A homogeneous, mixed emission of a mixed light, formed from the light of all light sources, can be achieved by mixing the light sources. It is thus possible for the light of the individual sub-signals to arrive at a receiver at the same time.

Some or all of the light sources may be supplied with a varying operating current. The operating current is modulated with regard to the current intensity according to the associated sub-signal. That is, the sub-signal specifies a modulation of the operating current intensity. The operating current intensity is preferably proportional or approximately proportional to the emitted light intensity of the respective light sources.

Some or all of the light sources may be supplied with a constant operating current, wherein the associated sub-signal is modulated by a variation of switching times of the operating current. In other words, the light sources may be operated in a manner similar to a pulse width modulation (PWM) wherein distribution of the activation times and switch-off times corresponds to the sub-signal. The light sources are connected to an operating current source, for example, via a transistor such as a metal oxide field-effect transistor so that the respective light sources can be switched on and off quickly by the transistor.

Some or all of the light sources may be configured for directed emission of the light into spatial angle regions that are different from each other. In particular, all light sources associated with a specific sub-signal are set up to emit radiation in a specific spatial direction. The corresponding spatial direction and/or the corresponding spatial angle range can be fixed or can also be changed during operation of the transmission system, for example, by a movable optical system such as a micro-electromechanical mirror (MEMS).

Readjustment to a user can be achieved by a specific division of the sub-signals to specific spatial angle ranges. As a result, overall transmission power can be saved. In other words, only spatial angle ranges are preferably supplied with the data in which a user or a device is located which requires the corresponding data.

The light sources each have an emission surface that emits the light. The emission surface is comparatively small. For example, the emission surface, also referred to as aperture, has an average diameter of at least 3 µm or 5 µm or 10 µm. Alternatively or additionally, the average diameter is at most 50 µm or 30 µm or 15 µm. The aperture and thus the emission surface is preferably circular or approximately circular when seen in plan view.

A wavelength of maximum intensity of the light as emitted by the light sources may each be at at least 365 nm or 400 nm and/or at a maximum of 490 nm or 440 nm. That is, the emitted light it can be near ultraviolet radiation or blue light. Alternatively, the wavelength of maximum intensity is at least 770 nm or 830 nm and/or at most 1.15 µm or 970 nm. That is, the emitted light can be near-infrared radiation. Alternatively, other colored light, for example, green light and/or yellow light and/or red light, can also be emitted.

The emitted light may be laser radiation. That is, the light as emitted by the individual light sources or as in sum, can have a comparatively high coherence length, for example, a coherence length of at least 0.1 mm or 1 mm or 10 mm.

We further provide a transmission system. The transmission system is designed for a method such as described in connection with one or more of the above examples. Features of the method are therefore also disclosed for the transmission system and vice versa.

The transmission system may comprise a plurality of light sources and one or more receiving devices that receive a data signal with data to be transmitted. The transmission system may further comprise one or more data processing units that decompose the data signal into N different sub-signals, wherein N is a natural number≥2. One or more driver units that drive the light sources on the basis of the sub-signal are present such that each of the light sources emits light according to one of the sub-signals. The light emitted by the light sources is set up to transmit the data, in particular, for the loss-free data transmission so that no data is lost during transmission.

A dedicated electrical supply line may be present in the transmission system that supplies current to the light sources associated with each sub-signal from the data processing unit and/or the associated driver unit to the corresponding light sources. As a result, limitations caused by excessively high currents in the electrical supply lines can be reduced. The light sources associated with a particular sub-signal are preferably electrically connected in parallel to each other.

The methods and transmission systems described here are explained in more detail below with reference to the drawings on the basis of examples. Identical reference signs indicate identical elements in the individual figures. However, no relationships to scale are shown here, but rather individual elements can be represented in an exaggerated manner for better understanding.

FIG. 1 shows an example of a transmission system 1. The transmission system 1 comprises a carrier 8. Electrical contact surfaces 7 can be located on the carrier 8. A driver unit 5, a receiving device 3 for data and a data processing unit 4 are mounted on the carrier 8.

The receiving device 3, the data processing unit 4 and the driver unit 5 can be monolithically integrated in a common electronic component, for example, in an integrated circuit. Deviating from the illustration of FIG. 1, separate components can also be attached to the carrier 8 for the driver unit 5, the receiving device 3 and the data processing unit 4. It is furthermore possible for the receiving device 3, the data processing unit 4 and/or the driver unit 5 to already be integrated partially or completely in the carrier 8, which is, for example, based on silicon.

Furthermore, a semiconductor chip 28 is located on the carrier 8. The semiconductor chip 28 has a plurality of light sources 2 arranged in a regular array. The light sources 2 are combined into groups 25 along rows. Within the groups 25, the light sources 2 are preferably electrically connected in parallel.

Each of the groups 25 is connected to the driver unit 5 via its own electrical supply line 6, which are in particular in the form of bonding wires. A current to operate the light sources 2 is conducted to the light sources 2 via the driver unit 5. The operation of the light sources 2 and of the groups 25 is carried out on the basis of a sub-signal S.

The light sources 2 and thus the entire semiconductor chip 28 can have a common electrical contact, in particular an earth contact, via one of the electrical contact surfaces 7. The remaining electrical contact surfaces 7 can be configured to receive a data signal A comprising data D, wherein the data D is processed in the data processing unit 4. An electrical supply voltage and/or power supply can be connected via the remaining electrical contact surface 7.

Figure 2:
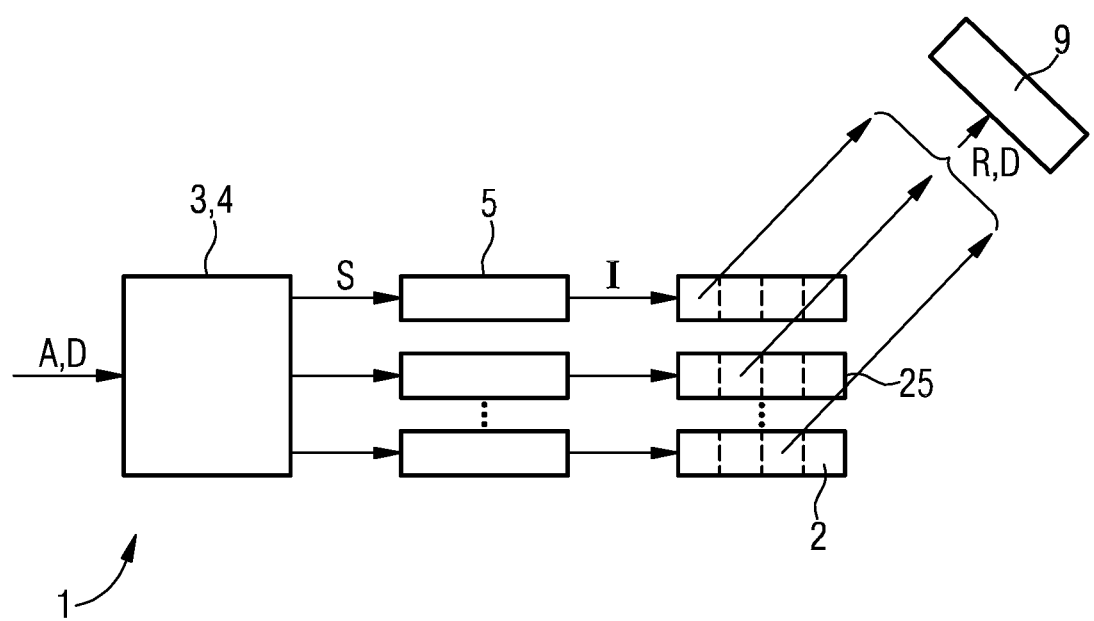
FIG. 2 is a schematic block diagram of an example of a transmission system.

Operation of the transmission system 1 is illustrated schematically in the block diagram of FIG. 2. The data D in the data signal A preferably arrives at the receiving device 3 in a wire-bound manner and is forwarded to the data processing unit 4. In the data processing unit 4, the data signal A is divided into a plurality of sub-signals S. The sub-signals S are forwarded to the driver units 5. An electric current I corresponding to the associated sub-signal S is modulated via the driver units 5 and forwarded to the groups 25 of the light sources 2.

A transmission with the complete data D results from a total of light R emitted by the groups 25, and the light R can be received at a receiving device 9 so that the data D can completely be reconstructed on the basis of the sub-signals S which are coded in the light R. A spatial distance between the light sources 2 and the receiving device 9 is, for example, at least 0.5 m or 2 m and/or at most 100 m or 50 m or 10 m. The light R is preferably near-infrared radiation.

The transmission system 1, optionally together with a receiving device, can be a portable device such as a mobile phone, a tablet or a notebook. Portable or stationary systems such as loudspeakers, video display devices such as a television or a beamer and associated data devices such as Blu-ray players or hard disk recorders can also be connected in terms of data transmission to one another in a wireless manner.

Figure 3:
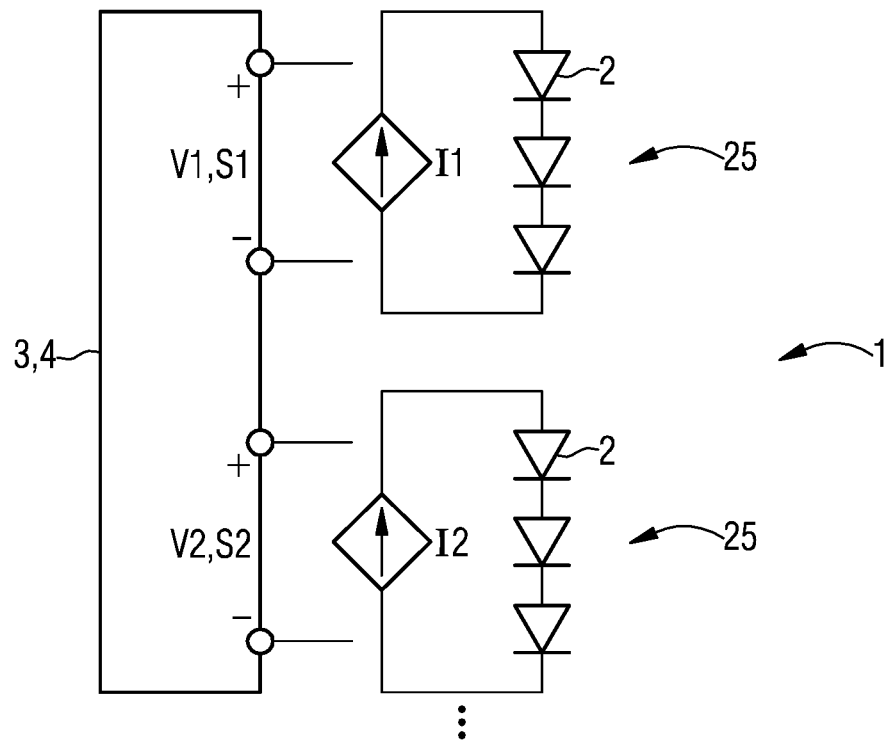
FIGS. 3 and 4 are schematic electrical diagrams for examples of transmission systems.

FIG. 3 is a schematic diagram of the transmission system 1 of FIG. 1. In accordance with FIG. 2, the groups 25 of the light sources 2 are operated via variable current sources with currents I1, I2. The variable current sources are, for example, voltage-controlled, starting from the data processing unit 4 and/or the driver unit 5 with voltages V1, V2. Alternatively and deviating from the illustration in FIG. 3, the current sources can also be addressed in a current-controlled manner.

Figure 4:
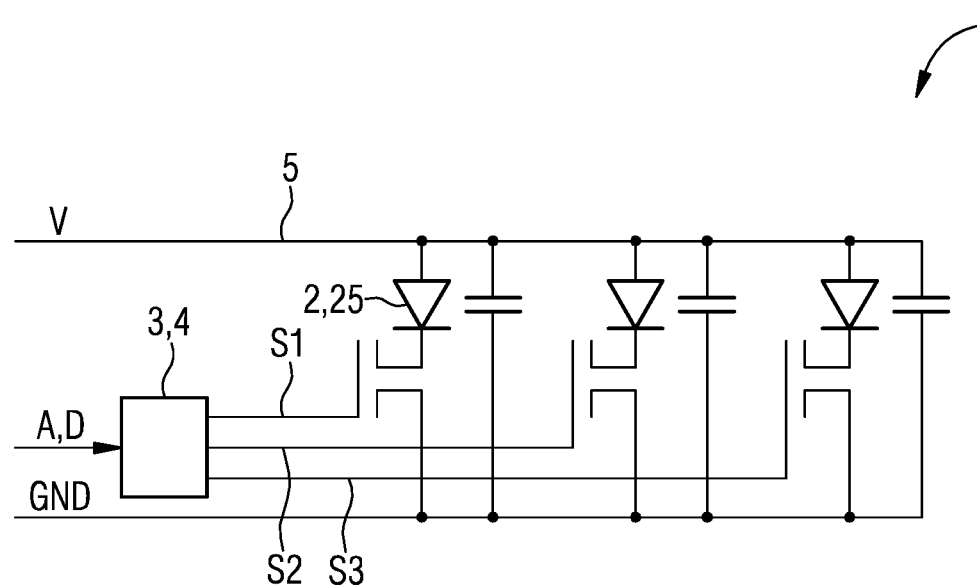

On the other hand, in the circuit of FIG. 4, a control takes place via transistors at which the sub-signals S1, S2, S3 are provided and controlled on the basis of the data processing unit 4 that receives the data signal A. A connection between a voltage line V, 5 and an earth line GND is achieved via the transistors so that a current flows through the light sources 2 as a function of the state of the transistors and the light sources 2 emit the light R. A capacitor is optionally connected in parallel with the light sources 2 or the groups 25 to allow the light sources 2 to react more rapidly, in particular, at higher currents.

For example, a total current for all light sources 2 taken together is at least 0.1 A and/or is at a maximum of 5 A. An optical output power of the transmission system 1 is preferably 0.1 W to 10 W. The same can apply to all other examples.

Figure 5:
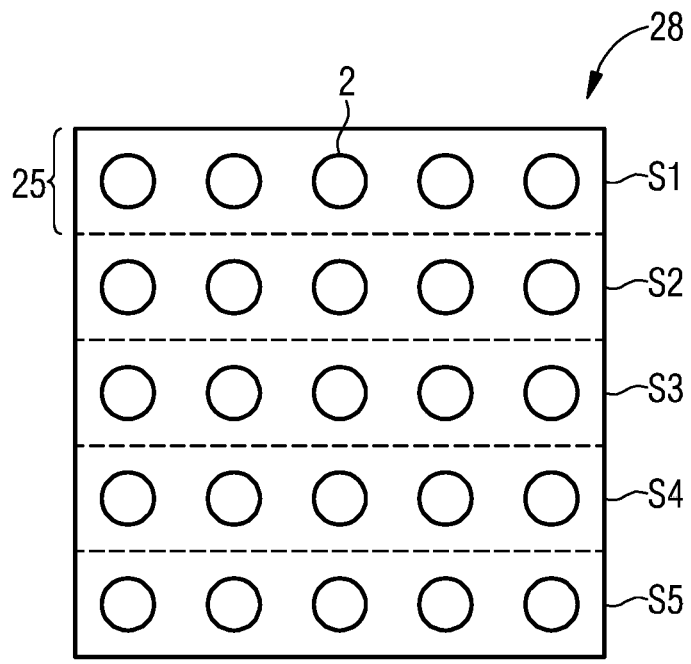
FIGS. 5 to 7 are schematic plan views of examples of transmission systems.

FIG. 5 shows, by way of example, the semiconductor chip 28 for examples of the transmission system 1. The light sources 2 are arranged in a regular array. Deviating from the illustration of FIG. 5, preferably in a row and/or in a column at least 10 or 20 of the light sources 2 are arranged, and alternatively or additionally at most 64 or 32 of the light sources 2 are arranged. For simplifying the illustration, the semiconductor chips 28 in the figures are each drawn only with a comparatively small number of light sources 2.

According to FIG. 5, the groups 25 extend continuously along the rows. Each one of the rows and thus each one of the groups 25 is driven with one of the sub-signals S1, S2, S3, S4, S5.

Figure 6A:
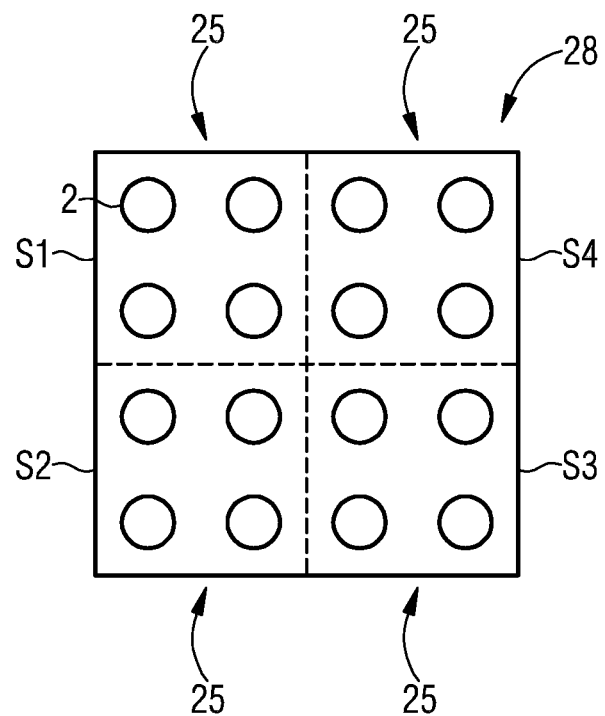

On the other hand, according to FIG. 6A, the groups 25 are arranged block by block and quadrant by quadrant. A corresponding block-by-block grouping of the light sources 2 can also be given in more than 4 sub-signals S1, S2, S3, S4, according to which the activation of the groups 25 takes place.

According to FIG. 6A, exactly one semiconductor chip 28 is present. Alternatively, see FIG. 6B, the groups 25 may be divided into individual semiconductor chips 28 so that each of the semiconductor chips 28 is provided for one of the sub-signals S1, S2, S3, S4.

Figure 6B:
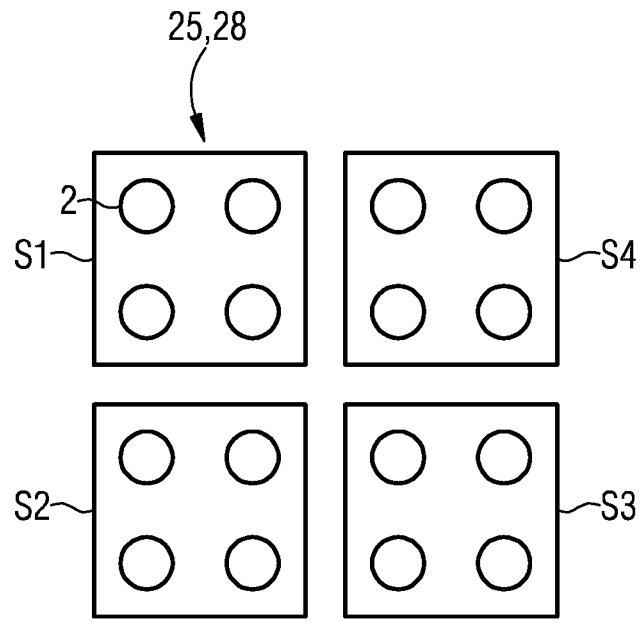

Also, mixed forms from FIGS. 6A and 6B are possible so that, on the one hand, a plurality of the semiconductor chips 28 are present, but a plurality of the groups 25 per semiconductor chip 28 are connected in a block-by-block manner.

Figure 7:
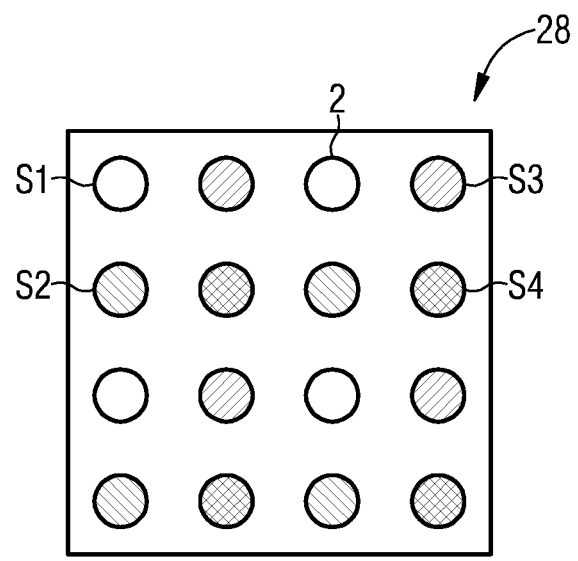

In the example of FIG. 7, the groups of light sources 2, which are driven via the sub-signals S1, S2, S3, S4, are arranged in a mixed manner Thus, no two light sources 2, which are driven with a specific one of the sub-signals S1, S2, S3, S4, are arranged directly adjacent to one another in the array.

Figure 8:
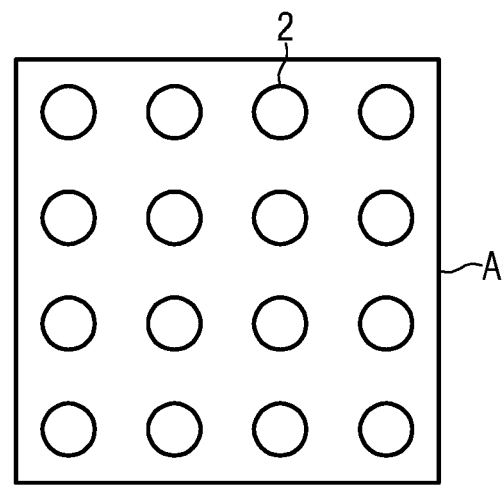
FIG. 8 is a schematic plan view of a modification of a transmission system.

FIG. 8 illustrates a conventional arrangement of the light sources 2. All light sources 2 are driven directly via the data signal A. As a result, higher operating currents are required, as a result of which an inductive limitation of the modulation frequency and thus of the bandwidth is provided. In such an arrangement, no preprocessing of the modulation signal takes place and the OFDM sub-signals are not transmitted to a plurality of levels, corresponding to the groups 25, but rather are impressed directly onto the light sources 2 as a superimposed signal.

In contrast to the configuration of FIG. 8, the limiting influence of the inductance per supply line is considerably reduced. Higher modulation frequencies and thus higher data rates per sub-signal S can thus be achieved. In addition, increased redundancy is achieved since, in the event of a failure of one of the light sources 2 or also of one of the sub-signals S, the remaining light sources 2 or the remaining sub-signals S and the groups 25 connected thereto are still functional.

Furthermore, in our configuration, generation of the overall signal for the data and for the OFDM is achieved only in the optical plane. As a result, an electronic susceptibility to faults can be reduced. The individual sub-signals S are preferably controlled synchronously by a common signal processor and/or driver, as illustrated in connection with FIGS. 1 to 4.

Per group 25 and thus per sub-signal S, according to our method, only 1/N of the total current is conducted via the corresponding electrical supply line 6, wherein N corresponds to the number of groups 25 and to the number of sub-signals N as a whole.

Figure 9:
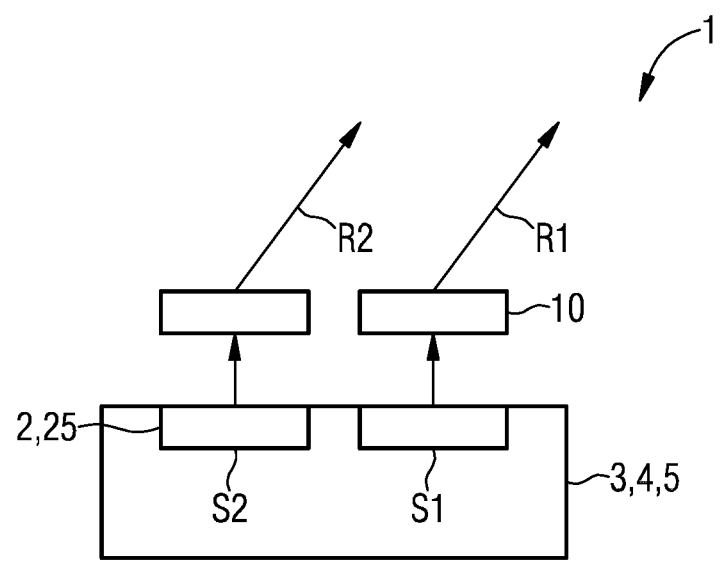
FIG. 9 is a schematic sectional view of an example of a transmission system.

According to FIG. 9, the transmission system comprises one or, preferably, a plurality of optical elements 10. The optical elements 10 can be assigned to the respective groups 25 or even to individual light sources 2. Via the optical elements 10, which can be monolithically integrated and combined in a single element, the light R1, R2 of the sub-signals S1, S2 can be emitted in different directions. The directions can be fixed and invariable, or alternatively can also be changed, for example, by moving components in the optical elements 10 during operation of the transmission system 1.

It is thus possible for different sub-signals S to be emitted in a targeted manner into different spatial angle regions. As a result, the data signal A can also be divided overall in different spatial directions or spatial angle ranges or can be each specifically emitted only into a specific spatial angle range. A specific distribution of the data D into different spatial areas is thus made possible.

Figure 10:
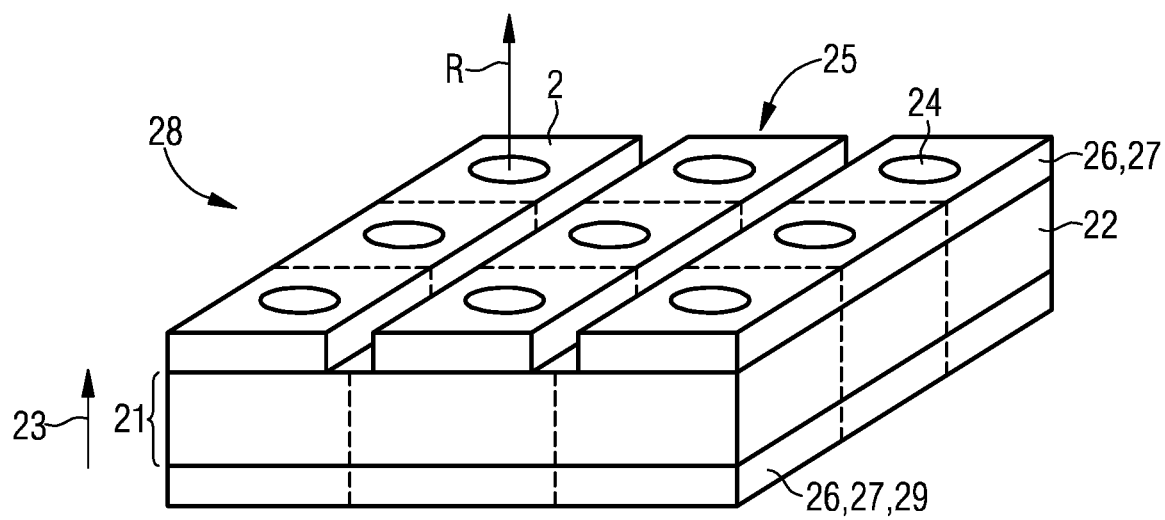
FIGS. 10 and 11 are schematic perspective views of examples of semiconductor chips for transmission systems.

FIG. 10 schematically illustrates a semiconductor chip 28. The semiconductor chip 28 has a substrate 29 on which a semiconductor layer sequence 22 that generates laser radiation is preferably located. Electrodes 27 and resonator mirrors 26 are mounted on both sides of the semiconductor layer sequence 21 such that the semiconductor layer sequence 22 essentially defines a resonator 21. The resonator 21 is aligned parallel to a growth direction 23 of the semiconductor layer sequence 22.

An electrode 27 facing away from the substrate 29 is structured, for example, to form strips. This structuring into strips can correspond to the division into the groups 25. In the electrode 27 facing away from the substrate 29, apertures 24 can also be formed, through which the light R emerges during operation.

Figure 11:
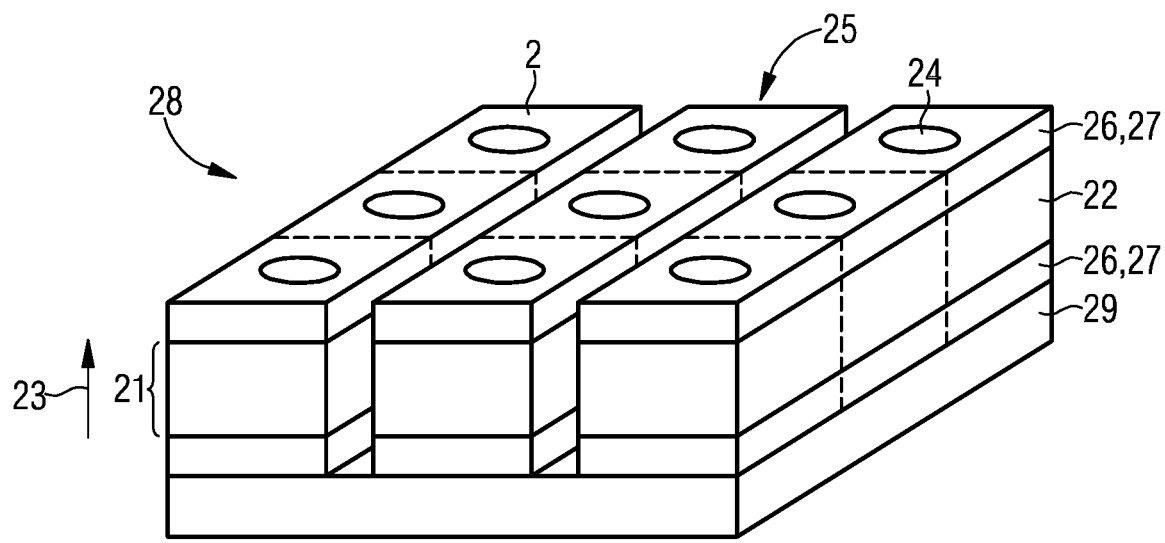

In the example of FIG. 10, the semiconductor layer sequence 22 is continuous and uninterrupted. In contrast, as shown in FIG. 11, it is also possible that the semiconductor layer sequence 22 and optionally also the electrode 27 on the substrate 29 are likewise structured to the groups 25, for example, in the form of a line. The same may apply to the resonator mirrors 26.

FIGS. 10 and 11 illustrate subdivision of the semiconductor layer sequence 22 and/or the electrodes 27 and the resonator mirrors 26 only in accordance with the arrangement of FIG. 5. A corresponding division can also apply to the configurations of FIGS. 6, 7 and 9.

The components shown in the figures are preferably each arranged directly on top of one another in the stated sequence, unless indicated otherwise. Layers that do not contact one another are preferably spaced apart from one another. If lines are drawn parallel to one another, the corresponding surfaces are preferably likewise aligned parallel to one another. Likewise, unless indicated otherwise, the relative positions of the illustrated components with respect to one another are reproduced correctly in the figures.

The methods and systems described herein are not limited by this description with reference to the examples. On the contrary, this disclosure comprises each new feature and any combination of features, in particular any combination of features in the appended claims, even if the feature or combination itself is not explicitly stated in the claims or examples.

This application claims priority of DE 10 2017 120 006.1, the subject matter of which is incorporated herein by reference.

The invention claimed is:

1. A method of transmitting optical data comprising:
providing a plurality of light sources in a transmission system,
transmitting a data signal with data to be transmitted to the transmission system,
decomposing the data signal in the transmission system into N different sub-signals, wherein N is a natural number with N≥2, and
controlling the light sources based on the sub-signals such that each of the light sources emits light according to one of the sub-signals and the light emitted overall by the light sources transmits the data,
wherein all light sources are structurally identical.

2. The method according to claim 1,
wherein the light sources are surface-emitting semiconductor lasers comprising a resonator in a direction parallel to a growth direction of a semiconductor layer sequence of the semiconductor lasers, and
the light sources are each operated with a mean driver current reduced by a factor N, compared to a control of the light sources directly by the data signal.

3. The method according to claim 2,
wherein the same semiconductor layer sequence is used for all the light sources.

4. The method according to claim 1, wherein the sub-signals are orthogonal to one another.

5. The method according to claim 4, wherein the data signal is decomposed into the sub-signals by an orthogonal frequency multiplex method.

6. The method according to claim 3,
wherein 4 to 200 of the light sources are unambiguously assigned to each sub-signal, and
each sub-signal is supplied to the associated light sources via a dedicated electrical supply line.

7. The method according to claim 6, wherein the light sources assigned to a specific sub-signal are each arranged in rows, seen in a plan view.

8. The method according to claim 6, wherein the light sources associated with a specific sub-signal are each arranged block by block, seen in plan view so that a field of at least 4×4 and at most 16×16 of said light sources is formed.

9. The method according to claim 6, wherein the light sources assigned to the sub-signals are arranged in a mixed manner, seen in plan view so that between adjacent light sources associated with one of the sub-signals, at least one light source associated with another one of the sub-signals is located.

10. The method according to claim 1, wherein at least some of the light sources are supplied with a varying operating current and the operating current is modulated with regard to the current intensity thereof according to the associated sub-signal.

11. The method according to claim 1, wherein at least some of the light sources are supplied with a constant operating current and the associated sub-signal is modulated by varying switching times of the operating current.

12. The method according to claim 1,
wherein at least some of the light sources are configured for directed emission of the light into spatial angle regions different from one another, and
into at least one of the spatial angle regions only a part of the data is sent.

13. The method according to claim 1,
wherein the light sources each have an emission surface that emits the light with an average diameter of 3 µm to 30 µm,
a wavelength of maximum intensity of the light of 365 nm to 490 nm, or 770 nm to 1.15 µm, and
the emitted light is laser radiation.

14. A transmission system configured to perform the method according to claim 1, comprising:
a plurality of light sources,
a receiving device that receives a data signal comprising data to be transmitted,
a data processor that decomposes the data signal into N different sub-signals, wherein N is a natural number with N≥2,
at least one driver that controls the light sources based on the sub-signals such that each one of the light sources emits light according to one of the sub-signals and the light emitted overall by the light sources is configured to transmit the data,
wherein all light sources are structurally identical.

15. The transmission system according to claim 14,
wherein energetization of the light sources assigned to each sub-signal from the data processor to the light sources, which are electrically connected in parallel with one another, is done by a dedicated electrical supply line.

16. A method of transmitting optical data, comprising:
providing a plurality of light sources in a transmission system,
transmitting a data signal with data to be transmitted to the transmission system,
decomposing the data signal in the transmission system into N different sub-signals, wherein N is a natural number with N≥2, and
controlling the light sources based on the sub-signals such that each of the light sources emits light according to one of the sub-signals and the light emitted overall by the light sources transmits the data,
wherein 4 to 200 of the light sources are unambiguously assigned to each sub-signal,
each sub-signal is supplied to associated light sources via a dedicated electrical supply line,
the light sources associated with a specific sub-signal are each arranged block by block, seen in plan view so that a field of at least 2×2 of said light sources is formed, and
at least some of the light sources are supplied with a varying operating current and the operating current is modulated with regard to the current intensity thereof according to the associated sub-signal.

* * * * *